(12) United States Patent
Sasaki

(10) Patent No.: US 10,529,274 B2
(45) Date of Patent: Jan. 7, 2020

(54) DISPLAY DEVICE

(71) Applicant: Japan Display Inc., Tokyo (JP)

(72) Inventor: Yusuke Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 56 days.

(21) Appl. No.: 15/814,461

(22) Filed: Nov. 16, 2017

(65) Prior Publication Data

US 2018/0151116 A1    May 31, 2018

(30) Foreign Application Priority Data

Nov. 29, 2016 (JP) ................................. 2016-231115

(51) Int. Cl.

| | |
|---|---|
| *G09G 3/3208* | (2016.01) |
| *H01L 51/50* | (2006.01) |
| *H01L 27/32* | (2006.01) |
| *H01L 51/52* | (2006.01) |
| *H01L 51/00* | (2006.01) |

(52) U.S. Cl.
CPC ....... *G09G 3/3208* (2013.01); *H01L 27/3241* (2013.01); *H01L 51/0002* (2013.01); *H01L 51/5036* (2013.01); *H01L 51/5203* (2013.01); *G09G 2310/0264* (2013.01)

(58) Field of Classification Search
CPC ..................... G09G 3/00; G09G 3/2096; G06F 1/1613–1618; G06F 1/162–1626; G06F 1/1634; G06F 1/1637; G06F 1/1641; G06F 2200/1634

See application file for complete search history.

(56) References Cited

U.S. PATENT DOCUMENTS

| | | | | |
|---|---|---|---|---|
| 5,714,286 A | * | 2/1998 | Uchikawa | ......... G02F 1/133512 430/20 |
| 9,349,988 B2 | | 5/2016 | Ryu et al. | |
| 2003/0076464 A1 | * | 4/2003 | Ozawa | .............. G02F 1/133512 349/113 |
| 2005/0007331 A1 | * | 1/2005 | Yamazaki | ............ G09G 3/2011 345/92 |
| 2006/0273711 A1 | * | 12/2006 | Luo | ..................... H01L 27/3288 313/500 |
| 2008/0179716 A1 | * | 7/2008 | Liu | ................... H01L 21/76819 257/659 |

(Continued)

*Primary Examiner* — Kent W Chang
*Assistant Examiner* — Nathaniel P Brittingham
(74) *Attorney, Agent, or Firm* — Michael Best & Friedrich LLP

(57) ABSTRACT

A display device includes a first substrate including a display region and a drive circuit arranged with a light emitting element having an organic layer including organic materials, a first metal oxide layer above a portion of the display region and a portion of the drive circuit, a first inorganic insulating layer above the display region and the drive circuit and having an opening exposing an upper surface of the first metal oxide layer, an organic insulating layer above the first metal oxide layer and the first inorganic insulating layer, a second metal oxide layer above the organic insulating layer in a region overlapping the first metal oxide layer, a second inorganic insulating layer above the display region and the drive circuit and having an opening exposing an upper surface of the second metal oxide layer, and a second substrate above the second inorganic insulating layer.

12 Claims, 16 Drawing Sheets

(56) References Cited

U.S. PATENT DOCUMENTS

| | | | | |
|---|---|---|---|---|
| 2010/0277448 | A1* | 11/2010 | Okamoto | G02F 1/133305 345/206 |
| 2011/0227822 | A1* | 9/2011 | Shai | G06F 1/1615 345/156 |
| 2013/0001601 | A1* | 1/2013 | Lee | H01L 51/5203 257/88 |
| 2014/0061619 | A1* | 3/2014 | Zhu | H01L 51/5256 257/40 |
| 2014/0231767 | A1* | 8/2014 | Tsai | H01L 51/5246 257/40 |
| 2015/0131017 | A1* | 5/2015 | Ro | G02F 1/133345 349/42 |
| 2015/0138103 | A1* | 5/2015 | Nishi | G02F 1/13452 345/173 |
| 2015/0162565 | A1* | 6/2015 | Ryu | H01L 51/5256 257/40 |
| 2015/0221891 | A1* | 8/2015 | Ghosh | H01L 51/5256 257/40 |
| 2017/0012239 | A1* | 1/2017 | Hoshina | H01L 51/5253 |
| 2018/0005600 | A1* | 1/2018 | Ikeda | G02F 1/133553 |
| 2018/0033833 | A1* | 2/2018 | An | G06F 3/0412 |
| 2018/0151116 | A1* | 5/2018 | Sasaki | H01L 51/5256 |

* cited by examiner

DISPLAY DEVICE

CROSS-REFERENCE TO RELATED APPLICATIONS

This application is based upon and claims the benefit of priority from the prior Japanese Patent Application No. 2016-231115, filed on Nov. 29, 2016, the entire contents of which are incorporated herein by reference.

FIELD

An embodiment of the present invention relates to a display device.

BACKGROUND

Conventionally, organic EL display devices (organic electroluminescence displays) are known as display devices in which organic electroluminescence materials (organic EL materials) are used in light emitting elements (organic EL elements) of a display portion. Organic EL display devices are different from liquid crystal display devices and the like, and are so-called self-illuminating type display devices in which display is realized by illuminating organic EL materials.

In recent years, in organic EL display devices such as this, covering light emitting elements by a sealing film in order to protect them from moisture and the like has been studied. For example, an organic EL display device having a sealing film above display elements and protecting the display elements from moisture and the like is disclosed (for example, U.S. Pat. No. 9,349,988).

SUMMARY

A display device in an embodiment of the present invention includes a first substrate including a display region and a drive circuit arranged with a light emitting element having an organic layer including organic materials, a first metal oxide layer above a portion of the display region and a portion of the drive circuit, a first inorganic insulating layer above the display region and the drive circuit and having an opening exposing an upper surface of the first metal oxide layer, an organic insulating layer above the first metal oxide layer and the first inorganic insulating layer, a second metal oxide layer above the organic insulating layer in a region overlapping the first metal oxide layer, a second inorganic insulating layer above the display region and the drive circuit and having an opening exposing an upper surface of the second metal oxide layer, and a second substrate above the second inorganic insulating layer, wherein a film thickness of the first metal oxide layer is thinner than a film thickness of the first inorganic insulating layer, and a film thickness of the second metal oxide layer is thinner than a film thickness of the second inorganic insulating layer.

A display device according to an embodiment of the present invention includes a first substrate having a display region and a drive circuit arranged with a light emitting element having an organic layer including organic materials, an organic insulating layer above the display region and the drive circuit, a metal oxide layer above a portion of the display region and a portion of the drive circuit, an inorganic insulating layer above the display region and the drive circuit and having an opening exposing an upper surface of the metal oxide film; and a second substrate above the inorganic insulating layer, wherein a film thickness of the metal oxide layer is thinner than a film thickness of the inorganic insulating layer.

DESCRIPTION OF EMBODIMENTS

Hereinafter, each embodiment of the present invention will be described while referencing the drawings and the like. However, without deviating from the gist, the present invention may be implemented in various ways, and interpretation is not limited to the content exemplified below. In order to provide a clearer description, some components of the drawings such as the width, thickness, and shape of each part are represented schematically. These schematic drawings are merely examples and do not limit interpretation of the present invention. In this specification and in each of the drawings, elements similar to previously described elements are marked with the same symbols and detailed descriptions are omitted accordingly.

In the present invention, when one film is manufactured and a plurality of films are formed, these plurality of films have different functions and roles. However, these plurality of films are derived from film formed as the same layer in the same step, and have the same layer structure and materials. Therefore, these plurality of films are defined as being in the same layer.

Further, in the present specification, expressions such as "above" and "below" used when describing the drawings express the relative location relationship between the structural component of focus and other structural components. In the present specification, in a side view, the direction facing the sealing film from the insulating surface to be described later is defined as "above," and the opposite direction is defined as "below." In the present specification and in the scope of the claims, when simply "above" is written to express a state in which a structural component is arranged above another structural component, as long as there are no limitations, includes both cases in which a structural component is arranged directly above so as to be in contact with another structural component, and in which a structural component is arranged above another structural component via further another structural component.

Figure 1:
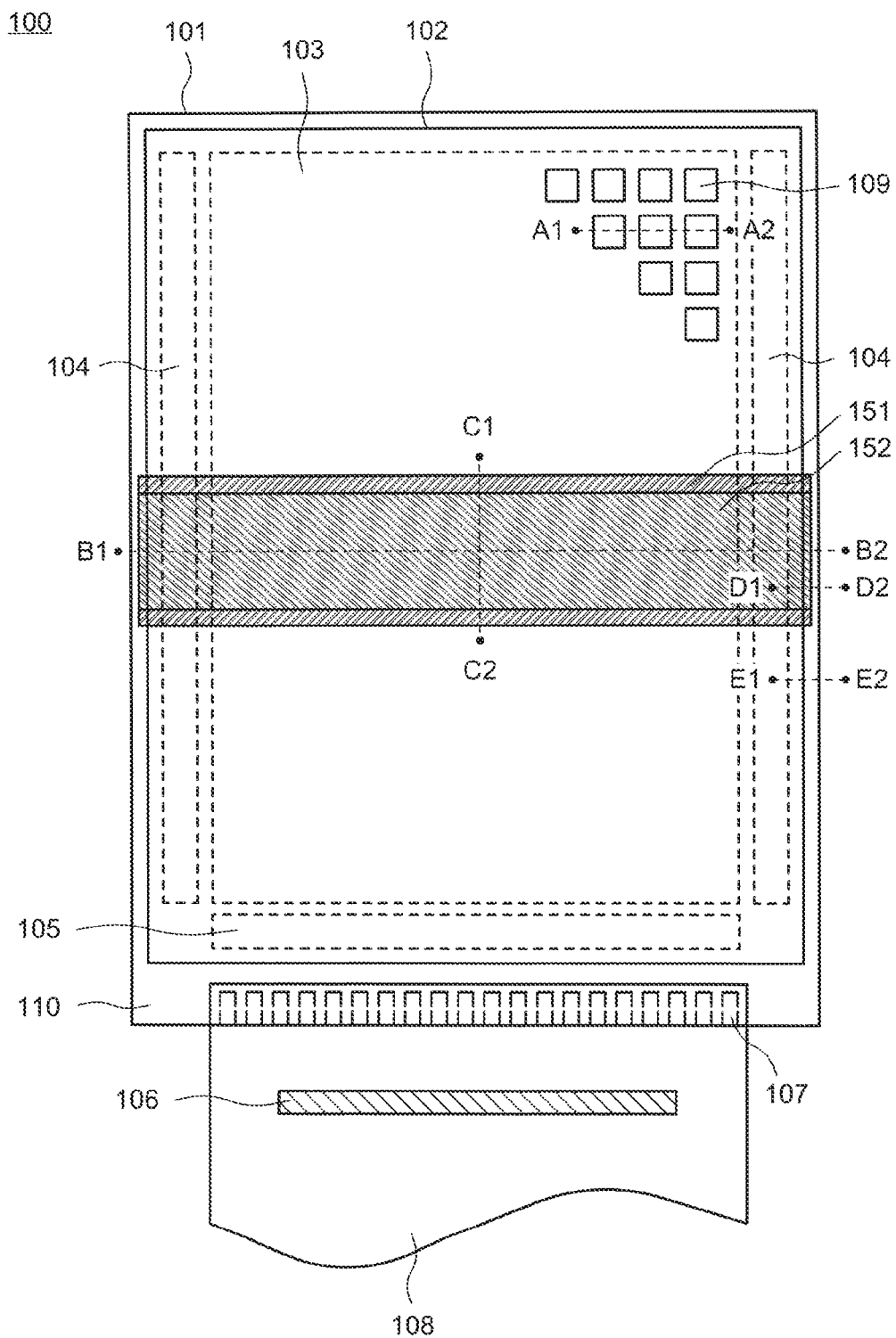
FIG. 1 is a schematic view showing the structure of a display device according to an embodiment of the present invention.

FIG. 1 is a schematic view showing the structure of a display device 100 according to an embodiment of the present invention, and shows a schematic structure in a case in which the display device 100 is seen from a planar view. In the present specification, a state in which the display device 100 is shown from a direction perpendicular to the screen (display region) is referred to as a "planar view."

As is shown in FIG. 1, the display device 100 has a display region 103, a scanning line drive circuit 104, a data line drive circuit 105, and a driver IC 106 formed above an insulating surface. A light emitting element having an organic layer including organic materials is arranged in the display region 103. A peripheral region 110 surrounds the periphery of the display region 103. The driver IC 106 functions as a control unit supplying signals to the scanning line drive circuit 104 and the data line drive circuit 105. The data line drive circuit 105 may be built into the driver IC 106. Although the driver IC 106 is provided above and attached externally to a flexible printed circuit (FPC) 108, it may also be arranged above a first substrate 101. The flexible printed circuit 108 is connected to terminals 107 provided in the peripheral region 110.

Here, the insulating surface is the surface of the first substrate 101. The first substrate 101 supports each layer of pixel electrodes and insulating layers provided above the insulating surface. The first substrate 101 itself may be formed of insulating materials and have an insulating surface, or a separate insulating film may be formed above the first substrate 101 forming an insulating surface. When an insulating surface is given, the materials of the first substrate and the materials forming the insulating film are not particularly limited.

In the display region 103 shown in FIG. 1, a plurality of pixels 109 are arranged in a matrix. Each of the pixels 109 includes a light-emitting element composed of a pixel electrode, an organic layer (light-emitting section) including a light-emitting layer stacked on the pixel electrode, and a common electrode (cathode). In each pixel 109, data signals are supplied in response to image data from the data line drive circuit 105. In accordance with these data signals, a transistor electrically connected to the pixel electrode provided in each pixel 109 is driven, and images may be displayed in response to the image data. Typically, a thin film transistor (TFT) may be used as the transistor. However, the transistor is not limited to a thin film transistor, and as long as there is an element equipped with a current control function, any kind of element may be used.

The display device 100 shown in FIG. 1 includes a first metal oxide layer 151 above a portion of the display region 103 and a portion of the scanning line drive circuit 104. A second metal oxide layer 152 is provided in a region overlapping the first metal oxide layer 151 above a portion of the display region 103 and a portion of the scanning line drive circuit 104. The first metal oxide layer 151 and the second metal oxide layer 152 are films with high bending resistance. Therefore, by bending the display device 100 at the region in which the first metal oxide layer 151 and the second metal oxide layer 152 overlap, the display device may have a high bending resistance. The first metal oxide layer 151 and the second metal oxide layer 152 will be described later in detail.

Figure 2:
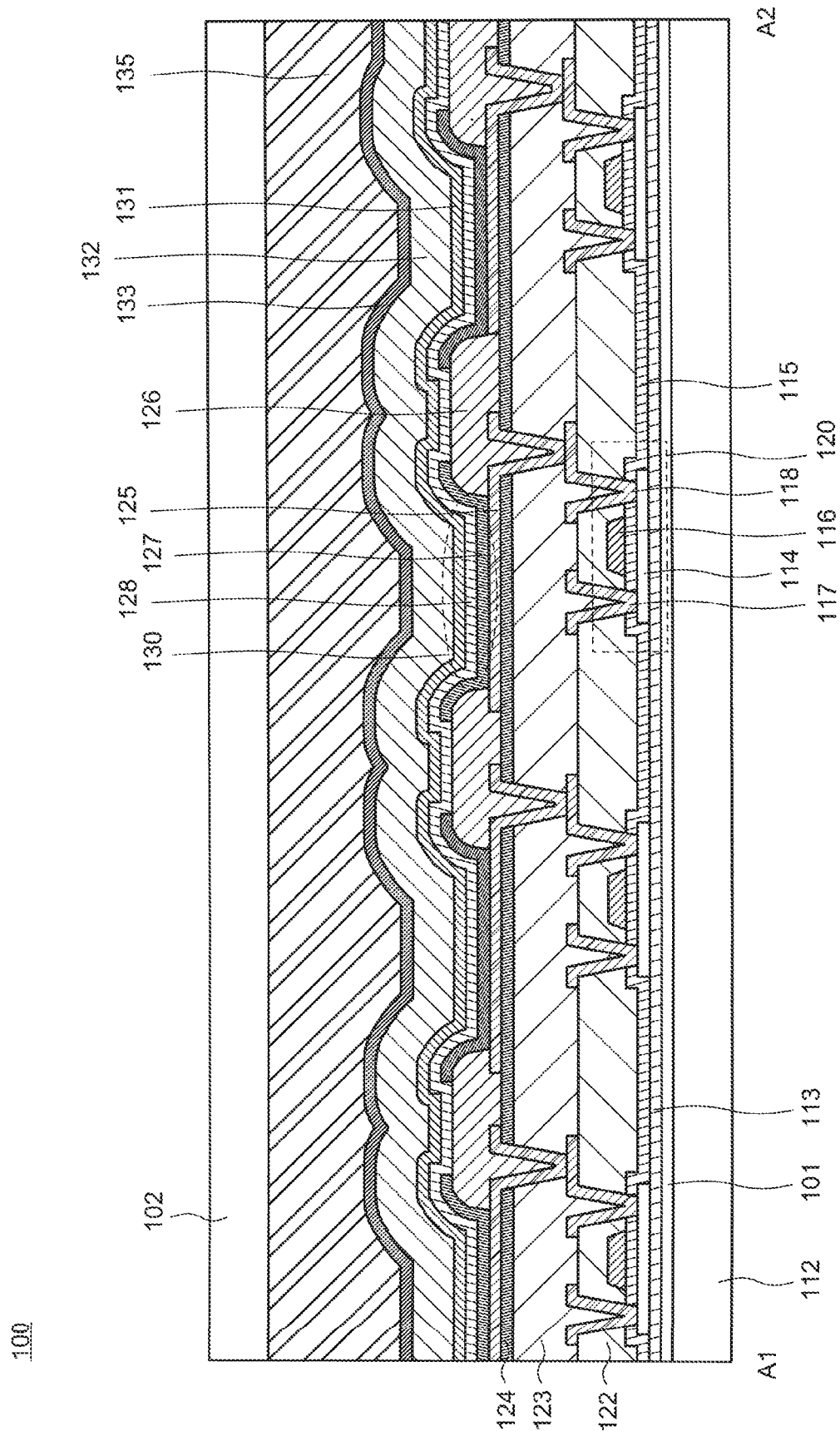
FIG. 2 is a cross-sectional view taken along line A1-A2 in FIG. 1.

FIG. 2 is a diagram showing an example of the structure of a pixel in the display device 100 of the present embodiment. Specifically, FIG. 2 is a diagram showing the structure of a cross-section taken at line A1-A2 of the display region 103 shown in FIG. 1. FIG. 2 shows a cross-section of three light emitting elements 130 as a portion of the display region 103. In FIG. 2, three light emitting elements 130 are exemplified, however, in the display region 103, more than several million light emitting elements correspond to the pixels and are arranged in a matrix.

As is shown in FIG. 2, the display device 100 has a first substrate 101, a second substrate 112, and a counter substrate 102. A glass substrate, a quartz substrate, a flexible substrate (polyimide, polyethylene terephthalate, polyethylene naphthalate, triacetylcellulose, cyclic olefin copolymer, cycloolefin polymer, and other resin substrates having flexibility) may be used as the first substrate 101, the second substrate 112, and the counter substrate 102. When it is not necessary for the first substrate 101, the second substrate 112, and the counter substrate 102 to have light transmissivity, a metal substrate, a ceramic substrate, or a semiconductor substrate may be used. The display device may be a bendable display device by using a substrate having flexibility as the first substrate 101, the second substrate 112, and the counter substrate 102.

A base film 113 is provided above the first substrate 101. The base film 113 is an insulating layer formed of inorganic material such as silicon oxide, silicon nitride, and aluminum oxide. The base film 113 is not limited to a single layer, and for example may have a stacked layer structure combining a silicon oxide layer and a silicon nitride layer. This structure may be appropriately determined by considering the adhesiveness to the first substrate 101 and the gas barrier against the later described transistor 120.

A transistor 120 is provided above the base film 113. The structure of the transistor 120 may be a top gate type or a bottom gate type. In the present embodiment, the transistor 120 includes a semiconductor layer 114 provided above the base film 113, a gate insulating film 115 covering the semiconductor layer 114, and a gate electrode 116 provided above the gate insulating film 115. An interlayer insulating film 122 covering the gate electrode 116 is provided above the transistor 120, and a source electrode or drain electrode 117 and a source electrode or drain electrode 118 each connected to the semiconductor layer 114 are provided above the interlayer insulating film 122. In the present embodiment, although an example is described in which the interlayer insulating film 122 has a single layer structure, the interlayer insulating film 122 may also have a stacked structure.

The materials of each layer configuring the transistor 120 may be known materials, and are not particularly limited. For example, polysilicon, amorphous silicon, or an oxide semiconductor may generally be used as the semiconductor layer 114. Silicon oxide or silicon nitride may be used as the gate insulating film 115. The gate electrode 116 may be configured by metal materials such as copper, molybdenum, tantalum, tungsten, or aluminum. Silicon oxide or silicon nitride may be used as the interlayer insulating film 122. The source electrode or drain electrode 117 and the source electrode or drain electrode 118 are each formed of metal materials such as copper, titanium, molybdenum, or aluminum.

Although not illustrated in FIG. 2, a first wiring formed of the same metal material as the metal material forming the gate electrode 116 may be provided in the same layer as the gate electrode 116. The first wiring, for example, may be provided as a scanning line and the like driven by the scanning line drive circuit 104. Additionally, although not illustrated in FIG. 2, a second wiring extending in a direction intersecting the first wiring may be provided in the same layer as the source electrode or drain electrode 117 and the source electrode or drain electrode 118. The second wiring, for example, may be provided as a data line or the like driven by the data line drive circuit 105.

A planarization film 123 is provided above the transistor 120. The planarization film 123 is configured including an organic resin material. Known organic resin material such as polyimide, polyamide, acrylic, and epoxy, for example, may be used as the organic resin material. These materials may be capable of forming a film by a solution coating method, and the method has an advantage that a highly planarization effect can be achieved. Although not illustrated, the planarization film 123 is not limited to a single layer structure, and may have a stacked structure of layers including organic resin materials and inorganic insulating layers.

The planarization film 123 has a contact hole exposing a portion of the source electrode or drain electrode 118. The contact hole is an opening for electrically connecting the pixel electrode 125 to be described later and the source electrode or drain electrode 118. Accordingly, the contact hole is provided overlapping a portion of the source electrode or drain electrode 118. The source electrode or drain electrode 118 is exposed at the bottom of the contact hole.

A protection film 124 is provided above the planarization film 123. The protection film 124 overlaps the contact hole formed in the planarization film 123. The protection film 124 preferably has a barrier property against moisture and oxygen, and for example, is formed using inorganic insulating materials such as silicon nitride film and aluminum oxide.

The pixel electrode 125 is provided above the protection film 124. The pixel electrode 125 overlaps the contact hole in the planarization film 123 and the protection film 124, and is electrically connected to the source electrode or drain electrode 118 exposed at the bottom of the contact hole. The display device 100 according to the present embodiment, the pixel electrode 125 functions as an anode configuring the light emitting element 130. The structure of the pixel electrode 125 is different depending on whether the display device is a top emission type or a bottom emission type. For example, in the case where the display device is a top emission type, a highly reflective metal film, or a stacked structure of metal film, and transparent conductive film with a high work function such as an indium oxide-based transparent conductive film (for example, ITO) and zinc oxide-based transparent conductive film (for example, IZO, ZnO) are used as the pixel electrode 125. Conversely, in the case where the display device is a bottom emission type, a previously described transparent conductive film is used as the pixel electrode 125. In the present embodiment, as an example, a top emission type organic EL display device is described. The edge portion of the pixel electrode 125 is covered by a first insulating layer 126 to be described later.

A first insulating layer 126 configured of organic resin material is provided above the pixel electrode 125. Known resin materials such as polyimide, polyamide, acrylic, epoxy, or siloxane may be used as the organic resin material. The first insulating layer 126 has an opening in a portion above the pixel electrode 125. The first insulating layer 126 is provided between adjacent pixel electrodes 125 so as to cover the edge portion of the pixel electrodes 125, and functions as a member separating the adjacent pixel electrodes 125. Therefore, the first insulating layer 126 may generally be called a "partition" or a "bank". A portion of the pixel electrode 125 exposed from the first insulating layer 126 is the light emitting region of the light emitting element 130. The inner wall of the opening of the first insulating layer 126 preferably has a taper shape. In this way, when the later described light emitting layer is formed, coverage defects in the edge portion of the pixel electrode 125 may be reduced. The first insulating layer 126 does not only cover the edge portion of the pixel electrode 125, and may also function as a filler filling concave portions caused by contact holes in the planarization film 123 and the protection film 124.

An organic layer 127 configured by organic materials is provided above the pixel electrode 125. The organic layer 127 has a light emitting layer formed of at least organic materials, and functions as the light emitting portion of the light emitting element 130. Other than the light emitting layer, a variety of charge transportation layers such as an electron injection layer, an electron transport layer, a hole injection layer, and a hole transport layer may also be included in the organic layer 127. The organic layer 127 is provided so as to cover the light emitting region, that is to say, to cover the opening of the first insulating layer 126 in the light emitting region.

In the present embodiment, each color of RGB is displayed by a structure in which a light emitting layer emitting light of a desired color is provided above the organic layer 127, and in which the organic layer 127 having different light emitting layers is formed above each pixel electrode 125. Namely, in the present embodiment, the organic layer 127 is not continuous between adjacent pixel electrodes 125. Each type of charge transportation layer is continuous between the adjacent pixel electrodes 125. Known structures and known materials may be used in the organic layer 127, and are not particularly limited to the structures of the present embodiment. The organic layer 127 may have a light emitting layer that emits white light, and may display each color of RGB through a color filter. In this case, the organic layer 127 may be provided above the first insulating layer 126.

A counter electrode 128 is provided above the organic layer 127 and the first insulating layer 126. The counter electrode 128 functions as a cathode configuring the light emitting element 130. Because the display device 100 of the present embodiment is a top emission type, a transparent electrode is used as the counter electrode 128. An MgAg thin film or a transparent conductive film (ITO or IZO) is used as the thin film configuring the transparent electrode. The counter electrode 128 is provided spanning between each pixel 109 above the first insulating layer 126. The counter electrode 128 is electrically connected to an external terminal via a lower conductive layer in the peripheral region of the edge portion of the display region 103. As described above, in the present embodiment, the light emitting element 130 is configured by a portion of the pixel electrode 125 (anode) exposed from the first insulating layer 126, an organic layer 127 (light emitting portion), and a counter electrode 128 (cathode).

A sealing film is preferably provided above the display region 103. The sealing film is provided in order to prevent the permeation of moisture and oxygen. The sealing film may be provided combining inorganic insulating materials and organic insulating materials. FIG. 2 shows a first inorganic insulating layer 131 (it is also called a first sealing film), a first organic insulating layer 132 (it is also called a second sealing film), and a second inorganic insulating layer 133 provided as an example of the sealing film. By providing a sealing film above the display region 103, moisture and oxygen may be prevented from permeating the light emitting element 130.

Film such as silicon nitride (SixNy), silicon oxynitride (SiOxNy), silicon nitride oxide (SiNxOy), aluminum oxide (AlxOy), aluminum nitride (AlxNy), aluminum oxynitride (AlxOyNz), or aluminum nitride oxide (AlxNyOz) may be used as the first inorganic insulating layer 131 and the second inorganic insulating layer 133 and formed by a CVD method or a sputtering method (x, y, z are arbitrary). The film thickness of the first inorganic insulating layer 131 is preferably 500 nm or more and 1000 nm or less, and the film thickness of the second inorganic insulating layer 133 is preferably 500 nm or more and 1000 nm or less. By providing the first inorganic layer 131 and the second inorganic layer 133 having a film thickness described above, moisture and oxygen may be prevented from permeating the light emitting element 130. Acrylic resin, epoxy resin, polyimide resin, silicon resin, fluorine resin, siloxane resin, and the like may be used as the first organic insulating layer 132. The film thickness of the first organic insulating layer 132 is preferably 5 μm or more and 15 μm or less.

A filler 135 is provided above the second inorganic insulating layer 133. The filler 135, for example, may use adhesives such as acrylic, rubber, silicon, and urethane. A spacer may be provided in the filler 135 in order to secure the spaces between the first substrate 101 and the counter substrate 102. A spacer such as this may be mixed in the filler 135, and may be formed above the first substrate 101 by resin and the like.

An overcoat layer also serving as a planarization layer, for example, may be provided in the counter substrate 102. When the organic layer 127 emits white light, a black matrix may be provided in and in between the color filters corresponding to each color of RGB on the principle surface (the surface facing the first substrate 101) of the counter substrate 102. When the color filter is not formed on the counter substrate 102 side, for example, a color filter may be formed directly above the second inorganic insulating layer 133, and a filler 135 may be formed above that. The first organic insulating layer 132 has a planarization function, and each layer above the first organic insulating layer 132 is flatly formed. For this reason, the first organic insulating layer 132 is thicker above the light emitting element 130 and thinner above the first insulating layer 126.

As described above, a sealing film is necessary in order to protect the light emitting element 130 from moisture and oxygen. However, when used as a bendable display device, the inorganic insulating layer functioning as a sealing film may be broken by bending the display device. When the inorganic insulating layer breaks, moisture, oxygen, and the like permeate from the outside and the light emitting element 130 deteriorates. The reliability of the display device may decrease due to the deterioration of the light emitting element 130. Here, when describing the bending resistance of film, the bending resistance of film is inversely proportional to the width of the film, and is inversely proportional to the cube of the thickness of the film. However, since the film thickness of the first inorganic insulating layer 131 and the second inorganic insulating layer 133 formed by a CVD method cannot be thin, the bending resistance of the film is lower.

The display device according to the present invention, in the bent portion of the display device, the inorganic insulating layer functioning as a sealing film is removed, and an insulating layer with greater bending resistance is provided instead of the inorganic insulating layer. A metal oxide, for example, may be provided as an insulating layer with a high bending resistance. Since this film is a suitable film which may be formed by an ALD method to be described later, the film thickness may be reduced. Since the film may be made thin, according to the theory that the bending resistance of the film is inversely proportional to the cube of the film thickness, the bending resistance of this metal oxide layer is greater. FIG. 1 shows an example in which the first metal oxide layer 151 and the second metal oxide layer 152 are provided in at least one portion of the display region 103. The display device shown in FIG. 1 may be bent at the region in which the second metal oxide layer 152 overlaps the first metal oxide layer 151. In FIG. 1, for example, the display device may be bent along line B1-B2.

Figure 3:
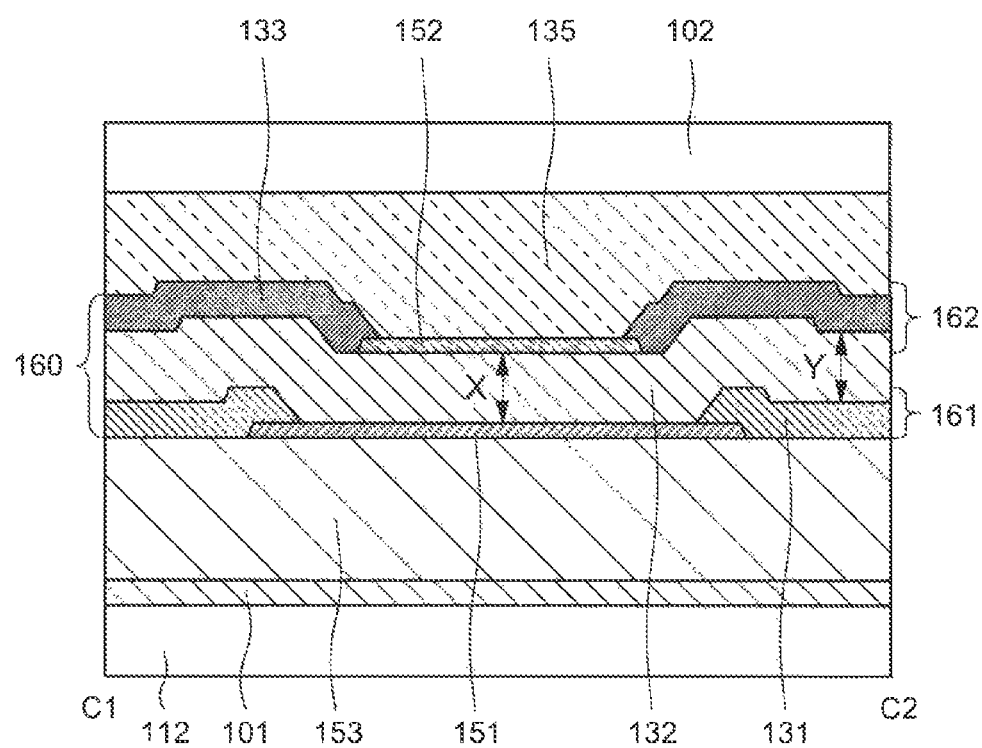
FIG. 3 is a cross-sectional view showing the structure of a display device according to an embodiment of the present invention.

A cross-sectional view taken along line C1-C2 in FIG. 1 is shown in FIG. 3. In FIG. 3, a layer including the transistor 120 and the light emitting element 130 in the display region 103 is illustrated as an element formation layer 153. The element formation layer 153 is provided above the first substrate 101, and the second substrate 112 is provided below the first substrate 101. The first metal oxide layer 151 is provided above the element formation layer 153. A sealing layer 160 is provided above the element formation layer 153. The sealing layer 160 includes the first inorganic insulating layer 131, the first metal oxide layer 151, the organic insulation material 132, the second inorganic insulating layer 133, and the second metal oxide layer 152. An inorganic insulation sealing layer 161 includes the first inorganic insulating layer 131 and the first metal oxide layer 151. A second inorganic insulation sealing layer 162 includes the second inorganic insulating layer 132 and the first metal oxide layer 152.

$Al_2O_3$, $HfO_2$, $HfSiO$, $La_2O_3$, $SiO_2$, STO, and the like may be used as the first metal oxide layer 151. The first metal oxide layer 151 is preferably formed by an atomic layer deposition method (ALD method). The ALD method is a method for forming thin film by forming an atomic monolayer in one cycle, then repeating that cycle. Since an even layer control is possible at the atomic layer level, the film may be highly even and excellent denseness. By forming the first metal oxide layer 151 by an ALD method, the film thickness of the first metal oxide layer 151 may be 10 nm or more and 100 nm or less. Because the first metal oxide layer 151 is formed by an ALD method, it may have a thin film thickness, thus it may be a film having high bending resistance. Thus, the first metal oxide layer 151 may be prevented from breaking even when the display device is bent. By forming the first metal oxide layer 151 by an ALD method, even if it is thin, it may be highly even and excellent denseness, thus moisture and oxygen may be prevented from permeating the light emitting element 130.

As shown in FIG. 3, the first inorganic insulating layer 131 is removed so as to expose the upper surface of the first metal oxide layer 151 in the region in which the first metal oxide layer 151 is provided. In the opening of the first inorganic insulating layer 131 exposing the upper surface of the first metal oxide layer 151, the first inorganic insulating layer 131 may be prevented from breaking by bending the display device. By providing the first inorganic insulating layer 131 in the region in which the display device is not bent, moisture and oxygen may be prevented from permeating the light emitting element 130.

The first organic insulating layer 132 is provided above the first metal oxide layer 151 and the first inorganic insulating layer 131. The first organic insulating layer 132 has a first region overlapping the first metal oxide layer 151 and a second region overlapping the first inorganic insulating layer 131. In the first organic insulating layer 132, the film thickness X of the first region is preferably substantially similar to the film thickness Y of the second region. By forming the film thickness of the first organic insulating layer 132 substantially the same in the first region and the second region, the refraction index of the path of emission of light of the light emitting element 130 may be even, thus optical misalignment may be eliminated.

The second metal oxide layer 152 is provided above the first organic insulating layer 132. The second metal oxide layer 152 is provided in a region overlapping the first metal oxide layer 151. The second metal oxide layer 152, similar to the first metal oxide layer 151, is formed by an ALD method using $Al_2O_3$, $HfO_2$, HfSiO, $La_2O_3$, $SiO_2$, and STO. By forming the second metal oxide layer 152 by an ALD method, the film thickness of the second metal oxide layer 152 may be 10 nm or more and 100 nm or less. By forming the second metal oxide layer 152 by an ALD method, the film thickness may be thin, thus it may have high bending resistance. Therefore, the second metal oxide layer 152 may be prevented from breaking even when the display device is bent. By forming the second metal oxide layer 152 by an ALD method, the film may be highly even and excellent denseness even if it is thin, thus moisture and oxygen may be prevented from permeating.

As is shown in FIG. 3, in the region in which the second metal oxide layer 152 is provided, the second inorganic insulating layer 133 is removed in order to expose the upper surface of the second metal oxide layer 152. In the opening of the second inorganic insulating layer 133 exposing the upper surface of the second metal oxide layer 152, the second inorganic insulating layer 133 may be prevented from breaking by bending the display device. By providing the second inorganic insulating layer 133 in the region in which the display device does not bend, moisture and oxygen may be prevented from permeating the light emitting element 130.

Here, $Al_2O_3$ will be used as an example to describe the differences between film formed by a CVD method and film formed by an ALD method. When $Al_2O_3$ is formed by a CVD method, trimethylaluminum (TMA) which is a precursor and $H_2O$ are simultaneously introduced to a reaction chamber, $Al_2O_3$ is generated, and $Al_2O_3$ is deposited onto the substrate. When $Al_2O_3$ is formed by an ALD method, TMA is chemically adsorbed to the substrate to form a single layer of TMA when the precursor of TMA is introduced to the reaction chamber. When a single layer of TMA is formed, the decomposed TMA and the TMA introduced later become unnecessary, thus exhaustion is performed (also referred to as purging). Next, when $H_2O$ is introduced to the reaction chamber, the single layer of TMA and $H_2O$ react, and a single layer of $Al_2O_3$ is formed. In addition, the decomposed $H_2O$ and the $H_2O$ introduced later become unnecessary, thus exhaustion is performed. By repeating these steps, $Al_2O_3$ may be formed one layer at a time.

In the CVD method, since the reaction products of a plurality of gases are deposited, hydrogen in the chamber is easily introduced into the film. For this reason, when the first inorganic insulating layer 131 and the second inorganic insulating layer 133 are formed by a CVD method, the hydrogen concentration increases. In the ALD method, one layer of TMA is adsorbed and reacted with $H_2O$ above the substrate, thus forming film one layer by layer. At this time, the unnecessary precursor is purged, thus making it difficult to introduce hydrogen into the film. For this reason, the hydrogen concentration of the first metal oxide layer 151 and the second metal oxide layer 152 formed by an ALD method is less than the hydrogen concentration of the first inorganic insulating layer 131 and the second inorganic insulating layer 133.

As is shown in FIG. 3, the first metal oxide layer 151 and the first inorganic insulating layer 131 are provided above the element formation layer 153. Further, the second metal oxide layer 152 and the second inorganic insulating layer 133 are provided above the first organic insulating layer 132. The first metal oxide layer 151 has a region not overlapping the first inorganic insulating layer 131, and the second metal oxide layer 152 has a region not overlapping the second inorganic insulating layer 133. Namely, since the first metal oxide layer 151, the first organic insulating layer 132, and the second metal oxide layer 152 are stacked in the bending part of the display device, the display device may have a high bending resistance. Since the first inorganic insulating layer 131, the first organic insulating layer 132, and the second inorganic insulating layer 133 are stacked in regions other than the bending part of the display device, the display device may have a high moisture and oxygen shut-off function.

Figure 4:
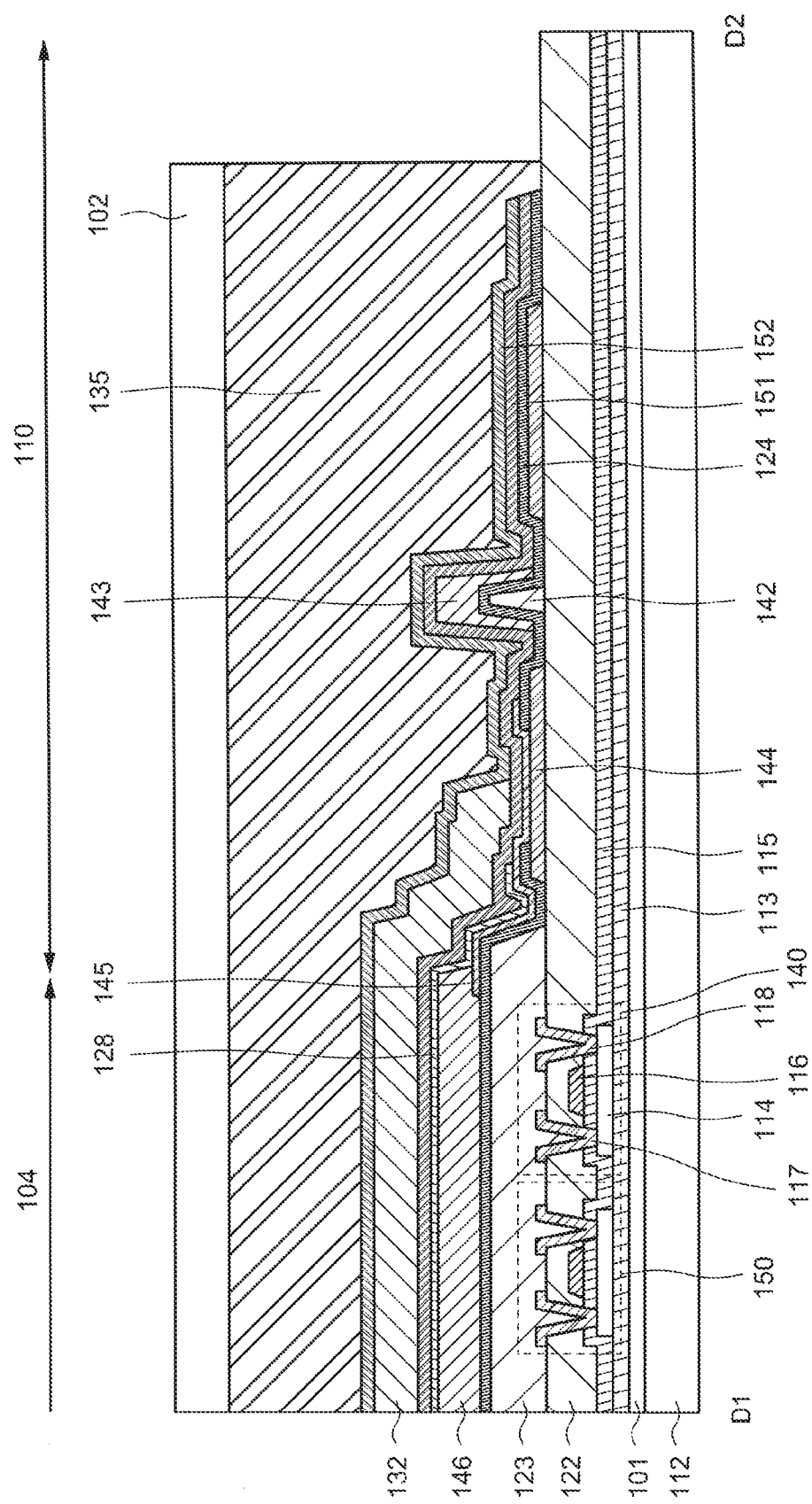
FIG. 4 is a cross-sectional view taken along line D1-D2 in FIG. 1.

A cross-sectional view taken along line D1-D2 shown in FIG. 1 is shown in FIG. 4. Specifically, it is a cross-sectional view of the peripheral region 110 of the outer side of the scanning line drive circuit 104 and the display region 103. As is shown in FIG. 4, in the peripheral region 110, the first inorganic insulating layer 131 and the second inorganic insulating layer 133 are removed, and the first metal oxide layer 151 and the second metal oxide layer 152 are provided instead.

In FIG. 4, the first substrate 101 is provided above the second substrate 112. The transistor 140 and the transistor 150 are provided above the first substrate 101 via the base film 113. The scanning line drive circuit 104 is configured by a plurality of transistors including the transistor 140 and the transistor 150. Further, the transistor 140 and the transistor 150 may have the same polarity, and may have a CMOS structure having different polarities. Similar to the display region 103, the interlayer insulating film 122 is formed above the transistor 140 and the transistor 150. A contact hole is formed in the interlayer insulating film 122, and the source electrodes or drain electrodes 117, 118 are connected to the semiconductor layer 114 of the transistor 140 via the contact hole. A wiring 144 is provided above the interlayer insulating film 122 in the peripheral region 110. The wiring 144 is formed from the same film as the source electrodes or drain electrodes 117, 118.

The planarization film 123 is provided above the interlayer insulating film 122 in the scanning line drive circuit 104. In the peripheral region 110, the planarization film 123 has an edge portion. Further, a first projecting portion 142 is provided above the interlayer insulating film 122 in the peripheral region 110. The first projecting portion 142 is formed from the same film as the planarization film 123.

The protection film 124 is provided above the planarization film 123. The protection film 124 is provided in contact with the edge portion of the planarization film 123. The protection film 124 preferably has a barrier function against moisture and oxygen. By providing the protection film 124 in contact with the edge portion of the planarization film 123, moisture and oxygen may be prevented from permeating from the edge portion of the planarization film 123. Further, by providing the protection film 124 in contact with the interlayer insulating film 122 and the wiring 144, moisture and oxygen may be prevented from permeating from the gaps between the protection film 124 and the interlayer insulating film 122.

An opening is provided in the protection film 124, and the wiring 144 is connected to an electrode 145 via the opening. The electrode 145 is formed from the same layer as the pixel electrode 125 of the light emitting element 130. A bank 146 is provided above the protection film 124 and the electrode 145. The bank 146 has an edge portion in the region overlapping the planarization film 123. A second projecting portion 143 is provided in the region overlapping the first projecting portion 142 via the protection layer 124. The bank 146 and the second projecting portion 143 are formed from the same film as the first insulating layer 126.

The counter electrode 128 is provided above the bank 146. The counter electrode 128 is formed so as to cover the entire surface of the display region 103 and the scanning line drive circuit 104. The part which connects the counter electrode 128 to the electrode 145 serves as a cathode contact. The electrode 145 is connected to the wiring 144 via the opening formed in the protection film 124. The cathode contact is provided so as to surround the display region 103 and the scanning line drive circuit 104 in the peripheral region 110 in order to prevent the cathode resistance from increasing. The wiring 144 is similarly provided so as to surround the display region 103 and the scanning line drive circuit 104 in the peripheral region 110. The cathode contact may be formed continuously encircling the display region 103 and the scanning line drive circuit 104 in a closed loop shape, or a shape in which a plurality of island-like cathode contacts encircle the display region 103 and the scanning line drive circuit 104 at intervals. The cathode contact may be arranged in an inverse U shape, not on the side of the display device 100 having the flexible print circuit 108. Further, an example is shown in which the cathode contact of the counter electrode 128 and the electrode 145 is provided in the peripheral region 110, however, the cathode contact may be provided in the region between the display region 103 and the scanning line drive circuit 104. By providing the counter electrode 128 in contact with the edge portion of the bank 146, moisture and oxygen may be prevented from permeating from the edge portion of the first insulating layer 126.

The first metal oxide layer 151 is provided above the protection film 124 and the counter electrode 128. The first metal oxide layer 151 is provided in contact with the protection film 124 in the peripheral region 110. Since the first metal oxide layer 151 and the protection film 124 are each formed of inorganic insulating materials, adhesion thereof may be improved. The protection film 124 is provided so as to cover the edge portion of the planarization film 123 and the edge portion of the bank 146. The edge portion of the planarization film 123 and the edge portion of the bank 146 formed of organic resin which become the points of entry for moisture and oxygen are preferably covered by the first metal oxide layer 151.

The first organic insulating layer 132 is provided above the first metal oxide layer 151. The first organic insulating layer 132 is provided so as to cover the edge portion of the planarization film 123 and the edge portion of the bank 146. The second metal oxide layer 152 is provided above the first metal oxide layer 151 and the first organic insulating layer 132. The second metal oxide layer 152 is in contact with the region in which the first organic insulating layer 132 is not formed and the first metal oxide layer 151.

As is shown in FIG. 4, since the first metal oxide layer 151 and the second metal oxide layer 152 are in contact, adhesion thereof may be improved. In the peripheral region 110, the regions in which the first metal oxide layer 151 and the second metal oxide layer 152 come in contact may increase by providing a first protruding portion and a second protruding portion. In this way, the first metal oxide layer 151 and the second metal oxide layer 152 may be prevented from peeling. Further, moisture and oxygen may be prevented from permeating from the outside of the display device. In addition, adhesion between the first metal oxide layer 151 and the protection film 124 may be improved, preferably by providing the first metal oxide layer 151 in contact with the protection film 124.

Figure 5:
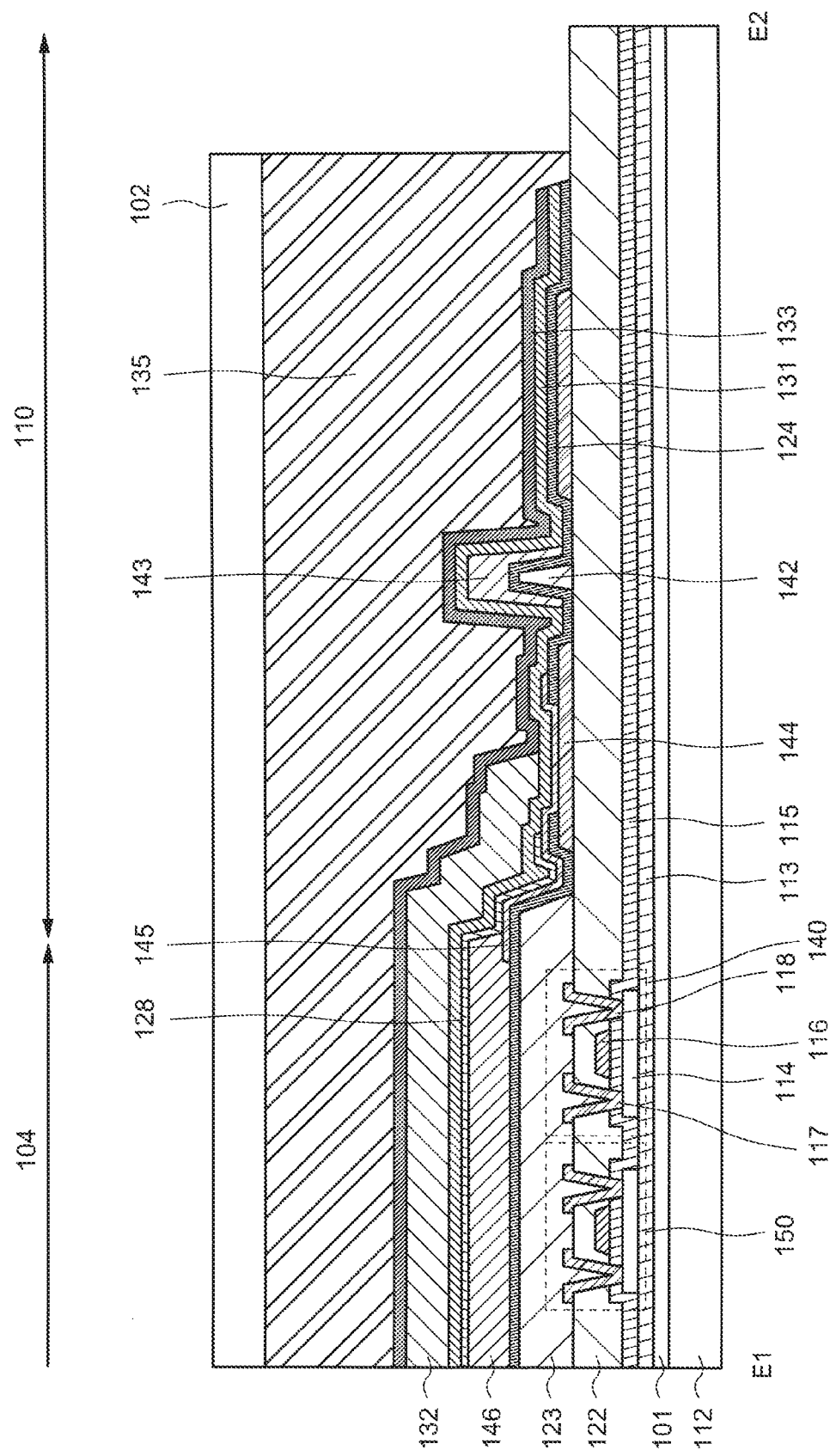
FIG. 5 is a cross-sectional view taken along line E1-E2 in FIG. 1.

A cross-sectional view taken along line E1-E2 shown in FIG. 1 is shown in FIG. 5. Specifically, this diagram is a cross-sectional view of the peripheral region 110 outside of the scanning line drive circuit 104 and the display region 103. The structure of FIG. 6 is similar to the structure of FIG. 4, except that the first inorganic insulating layer 131 and the second inorganic insulating layer 133 are provided instead of the first metal oxide layer 151 and the second metal oxide layer 152.

As is shown in FIG. 5, the sealing film above the scanning line drive circuit 104 has a structure in which the first inorganic insulating layer 131, the first organic insulating layer 132, and the second inorganic insulating layer 133 overlap. The film thickness of first inorganic insulating layer 131 and the second inorganic insulating layer 133 have a greater film thickness than that of the first metal oxide layer 151 and the second metal oxide layer 152. For this reason, compared to the first metal oxide layer 151 and the second metal oxide layer 152, the first inorganic insulating layer 131 and the second inorganic insulating layer 133 may further prevent the permeation of moisture and oxygen. The first inorganic insulating layer 131 and the second inorganic insulating layer 133 are in contact in the peripheral region 110. Thus, adhesion may be improved between the first inorganic insulating layer 131 and the second inorganic insulating layer 133. Further, moisture and oxygen may be prevented from permeating from between the first inorganic insulating layer 131 and the second inorganic insulating layer 133. Thus, the reliability of the display device may be improved.

Figure 6:
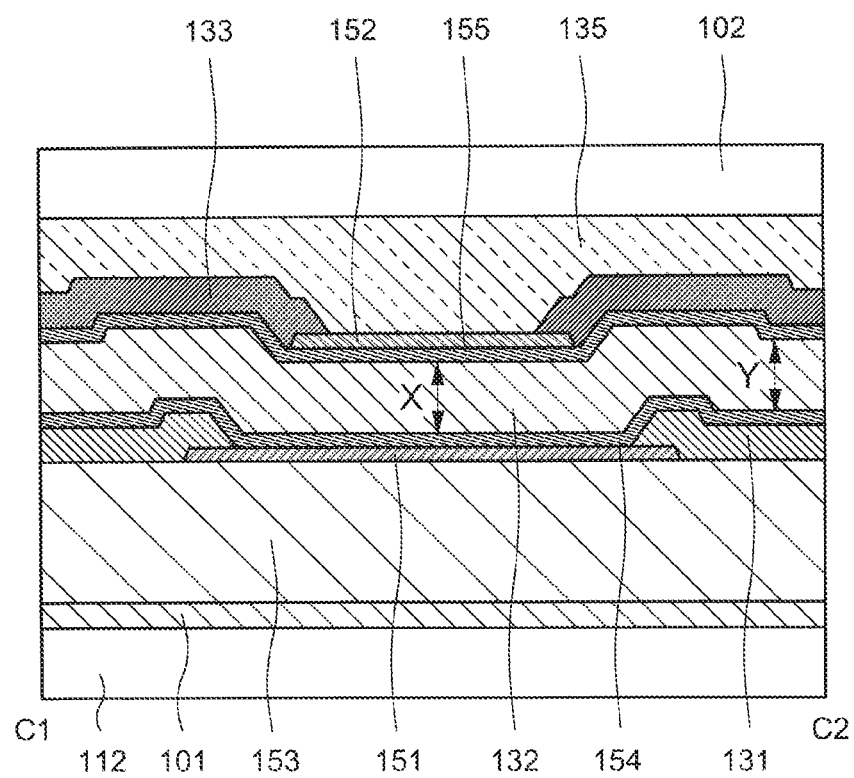
FIG. 6 is a cross-sectional view showing the structure of a display device according to an embodiment of the present invention.

In FIG. 6, a display device is shown having a structure in which a portion thereof differs from that of the display device shown in FIG. 3. The display device shown in FIG. 6, in addition to the structure of the display device shown in FIG. 6, the first metal oxide layer 151 and the first inorganic insulating layer 131 are provided above the element formation layer 153. An inorganic interface layer 154 is provided between the first metal oxide layer 151, the first inorganic insulating layer 131, and the first organic insulating layer 132. An inorganic interface layer 155 is provided between the first organic insulating layer 132, the second metal oxide layer 152, and the second inorganic insulating layer 133.

Silicon oxide and amorphous silicon may be used as the inorganic interface layer 154 and the inorganic interface layer 155. Adhesion may be improved between the first organic insulating layer 132, and the first metal oxide layer 151 and the first inorganic insulating layer 131 by providing the inorganic interface layer 154 between the first organic insulating layer 132, and the first metal oxide layer 151 and the first inorganic insulating layer 131. In this way, the first metal oxide layer 151, and the first inorganic insulating layer 131 and the first organic insulating layer 132 may be prevented from peeling, thus the reliability of the display device may be improved. Similarly, adhesion may be improved between the first organic insulating layer 132, and the second metal oxide layer 152 and the second inorganic insulating layer 133 by providing the inorganic interface layer 155 between the first organic insulating layer 132, and the second metal oxide layer 152 and the second inorganic insulating layer 133. In this way, the second metal oxide layer 152 and the second inorganic insulating layer 133, and the first organic insulating layer 132 may be prevented from peeling, thus the reliability of the display device may be improved.

Figure 7:
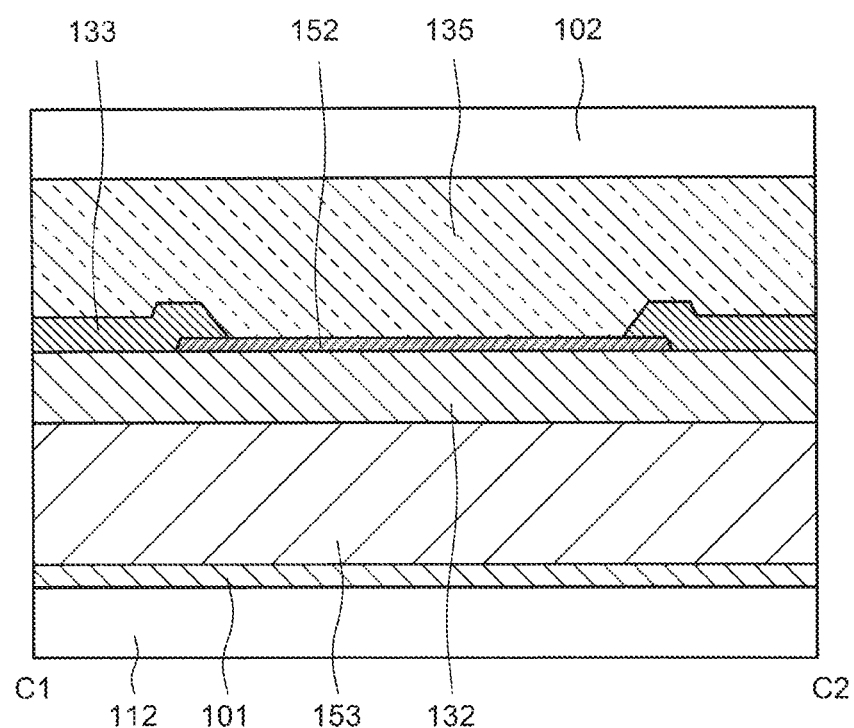
FIG. 7 is a cross-sectional view showing the structure of a display device according to an embodiment of the present invention.

In FIG. 7, a display device is shown having a structure in which a portion thereof differs from that of the display device shown in FIG. 1. The display device shown in FIG. 7, the first inorganic insulating layer 131 and the first metal oxide layer 151 are omitted. In FIG. 7, the first organic insulating layer 132 is provided above the element formation layer 153, and the second metal oxide layer 152 and the second inorganic insulating layer 133 are provided above the first organic insulating layer 132. In the region in which the second metal oxide layer 152 is provided, the second inorganic insulating layer 133 is removed so as to expose the upper surface of the second metal oxide layer 152. In the opening of the second inorganic insulating layer 133 exposing the upper surface of the second metal oxide layer 152, the second inorganic insulating layer 133 may be prevented from breaking due to bending the display device. The display device shown in FIG. 7, the second metal oxide layer 152 and the first inorganic insulating layer 131 may be omitted, thus the manufacturing process may be simplified compared to that of the display device of FIG. 3.

Figure 8:
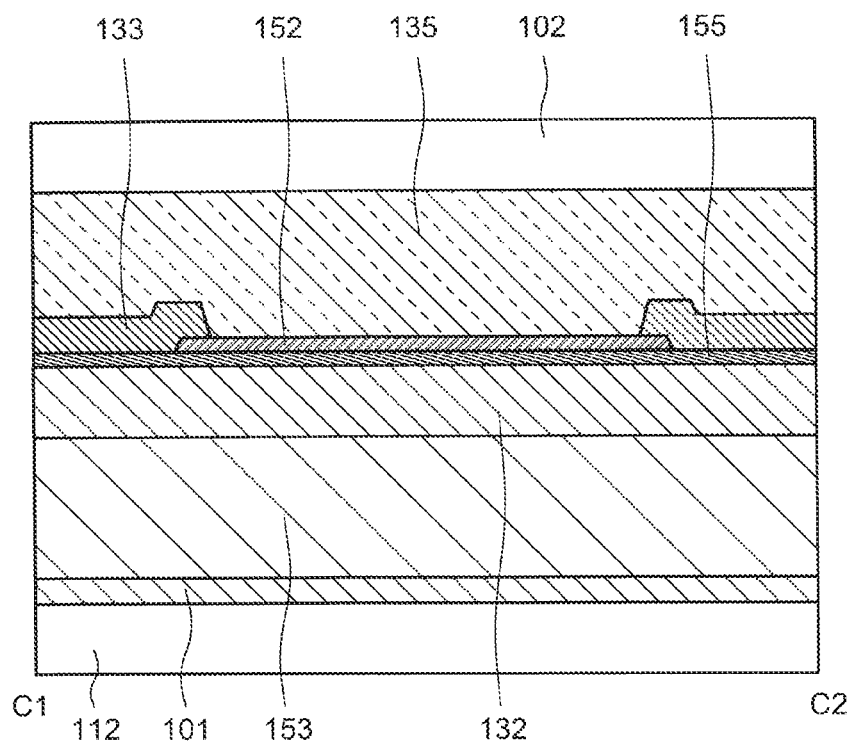
FIG. 8 is a cross-sectional view showing the structure of a display device according to an embodiment of the present invention.

In FIG. 8, a display device is shown having a structure in which a portion thereof differs from that of the display device shown in FIG. 7. The display device shown in FIG. 8, in addition to the structure of the display device shown in FIG. 7, the inorganic interface layer 155 is provided between the first organic insulating layer 132, and the second metal oxide layer 152 and the second inorganic insulating layer 133. In this way, adhesion may be improved between the first organic insulating layer 132, and the second metal oxide layer 152 and the second inorganic insulating layer 133. The first organic insulating layer 132, and the second metal oxide layer 152 and the second inorganic insulating layer 133 may be prevented from peeling, thus the reliability of the display device may be improved.

Figure 9:
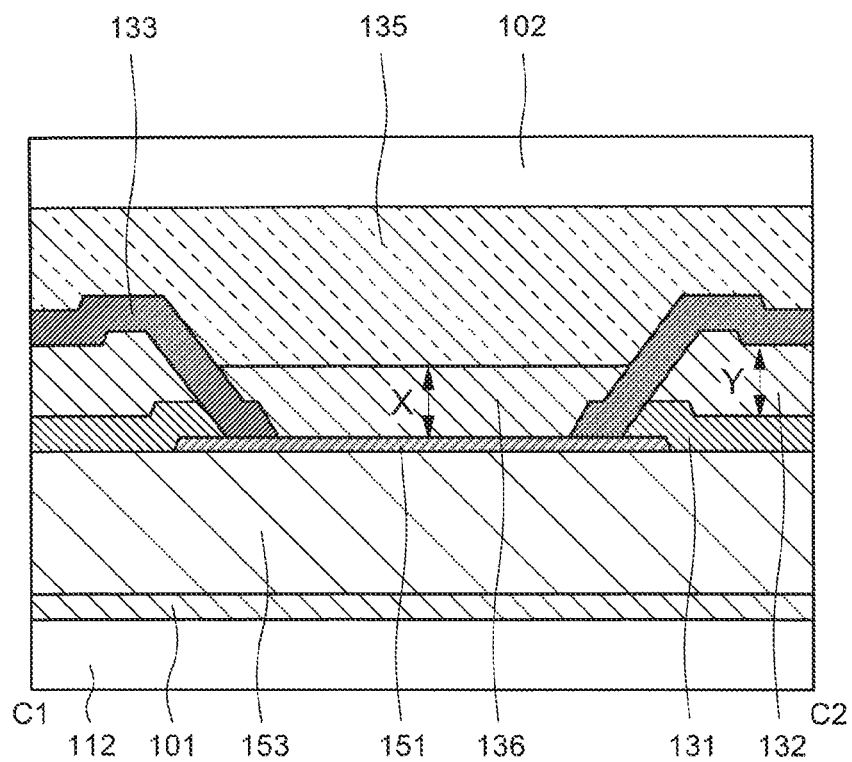
FIG. 9 is a cross-sectional view showing the structure of a display device according to an embodiment of the present invention.

The display device shown in FIG. 9, the first metal oxide layer 151 is provided above the element formation layer 153. The first organic insulating layer 132 is provided above the first inorganic insulating layer 131. The first metal oxide layer 151 has a region in which the first inorganic insulating layer 131 and the first organic insulating layer 132 do not overlap. Further, the first inorganic insulating layer 131 and the second inorganic insulating layer 133 are provided in contact in the regions of the first metal oxide layer 151 in which the first inorganic insulating layer 131 and the first organic insulating layer 132 do not overlap. In addition, the second organic insulating layer 136 is provided in the region of the first metal oxide layer 151 in which the first inorganic insulating layer 131 and the first organic insulating layer 132 do not overlap. The second organic insulating layer 136 may be formed using the same materials as the first organic insulating layer 132. The film thickness Y of the first organic insulating layer 132 and the film thickness X of the second organic insulating layer 136 are preferably substantially the same.

The display device shown in FIG. 9, the first inorganic insulating layer 131 and the second inorganic insulating layer 133 may be prevented from breaking by bending the display device in the region of the first metal oxide layer 151 in which the first inorganic insulating layer 131 and the second inorganic insulating layer 133 do not overlap. The first inorganic insulating layer 131 and the second inorganic insulating layer 133 are provided in contact with each other above the first metal oxide layer 151. In this way, adhesion may be improved between the first inorganic insulating layer 131 and the second inorganic insulating layer 133. In the bending part of the display device, the first inorganic insulating layer 131 and the second inorganic insulating layer 133 may be prevented from peeling even if the display device is bent. In addition, moisture and oxygen may be prevented from permeating from between the first inorganic insulating layer 131 and the second inorganic insulating layer 133, thus deterioration of the light emitting element 130 may be prevented. Thus, the reliability of the display device may be improved. By providing the second organic insulating layer 136 above the first metal oxide layer 151 with the same film thickness as that of the first organic insulating layer 132, the refraction index of the path of emission of light of the light emitting element 130 may be even, thus optical misalignment may be eliminated.

Figure 10:
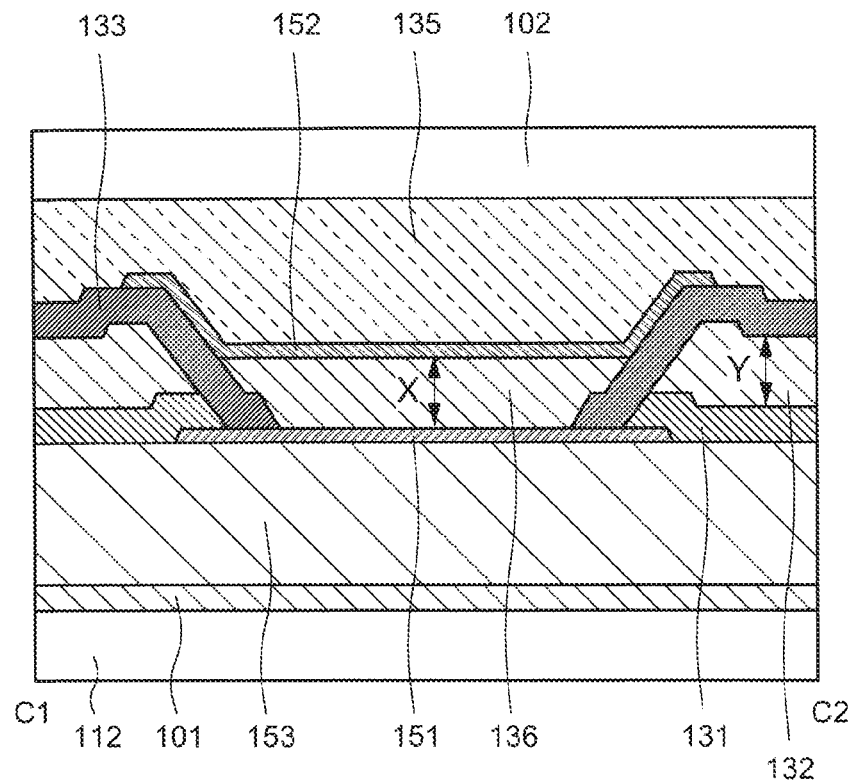
FIG. 10 is a cross-sectional view showing the structure of a display device according to an embodiment of the present invention.

In FIG. 10, a display device is shown having a structure in which a portion thereof differs from that of the display device shown in FIG. 9. The display device shown in FIG. 10, in addition to the structure of the display device shown in FIG. 9, the second metal oxide layer 152 formed by an ALD method is further provided above the second inorganic insulating layer 133 and the second organic insulating layer 136. Moisture and oxygen may be prevented from permeating from the outside by providing the second metal oxide layer 152 above the first organic insulating layer 132 and the second inorganic insulating layer 133. Adhesion may be improved between the second metal oxide layer 152 and the second inorganic insulating layer 133 by providing the second metal oxide layer 152 in contact with the second inorganic insulating layer 133. In this way, in the bending part of the display device, the second metal oxide layer 152 and the second inorganic insulating layer 133 may be prevented from peeling even if the display device is bent. Moisture and oxygen may be prevented from permeating from between the second metal oxide layer 152 and the second inorganic insulating layer 133, thus deterioration of the light emitting element 130 may be prevented. In this way, the reliability of the display device may be improved.

Figure 11:
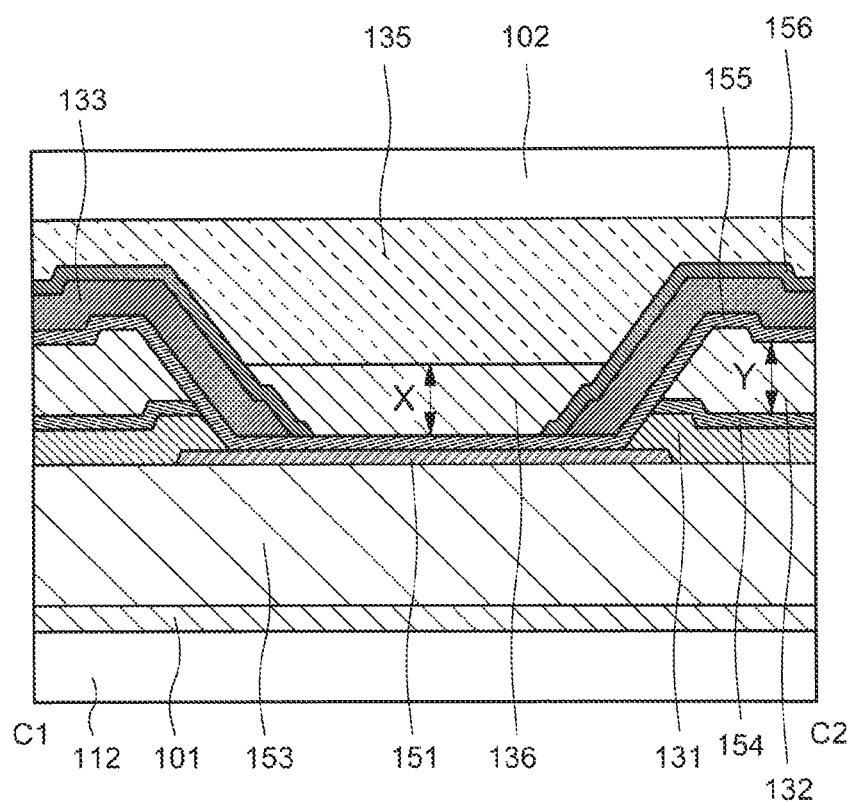
FIG. 11 is a cross-sectional view showing the structure of a display device according to an embodiment of the present invention.

In FIG. 11, a display device is shown having a structure in which a portion thereof differs from that of the display device shown in FIG. 9. The display device shown in FIG. 11, in addition to the structure of the display device shown in FIG. 9, is provided with an inorganic interface layer between an inorganic insulating layer and an organic insulating layer. Specifically, the inorganic interface layer 154 is provided between the first inorganic insulating layer 131 and the first organic insulating layer 132. The first metal oxide layer 151 has a region in which the first inorganic insulating layer 131, the inorganic interface layer 155, and the first organic insulating layer 132 do not overlap. The inorganic interface layer 155 is provided above the first metal oxide layer 151 and the first organic insulating layer 132. The second inorganic insulating layer 133 is provided above the first metal oxide layer 151 and the first organic insulating layer 132 via the inorganic interface layer 155, and the first metal oxide layer 151 has a region which does not overlap the second inorganic insulating layer 133. The inorganic interface layer 156 is provided above the second inorganic insulating layer 133, and the first metal oxide layer 151 has a region which does not overlap the inorganic interface layer 156. The first metal oxide layer 151 is provided with the second organic insulating layer 136 in the region not overlapping the second inorganic insulating layer 133 and the inorganic interface layer 156.

Adhesion may be improved between the first inorganic insulating layer 131 and the first organic insulating layer 132 by providing the inorganic interface layer 155 between the first inorganic insulating layer 131 and the first organic insulating layer 132. In addition, adhesion may be improved between the first organic insulating layer 132 and the second inorganic insulating layer 133 by providing the inorganic interface layer 156 between the first organic insulating layer 132 and the second inorganic insulating layer 133. Further, adhesion may be improved between the second inorganic insulating layer 133 and the second organic insulating layer 136 by providing the inorganic interface layer 156 between the second inorganic insulating layer 133 and the second organic insulating layer 136. Still further, adhesion may be improved between the first metal oxide layer 151 and the second organic insulating layer 136 by providing the inorganic interface layer 156 between the first metal oxide layer 151 and the second organic insulating layer 136. Namely, by providing an inorganic interface layer between an organic insulating layer and an inorganic insulating layer, film may be prevented from peeling between the organic insulating layer and the inorganic insulating layer when the display device is bent. Thus, the reliability of the display device may be improved. By making the film thickness Y of the first organic insulating layer 132 substantially the same as the film thickness X of the second organic insulating layer 136, the refraction index of the path of emission of light of the light emitting element 130 may be even, thus optical misalignment may be eliminated.

Figure 12:
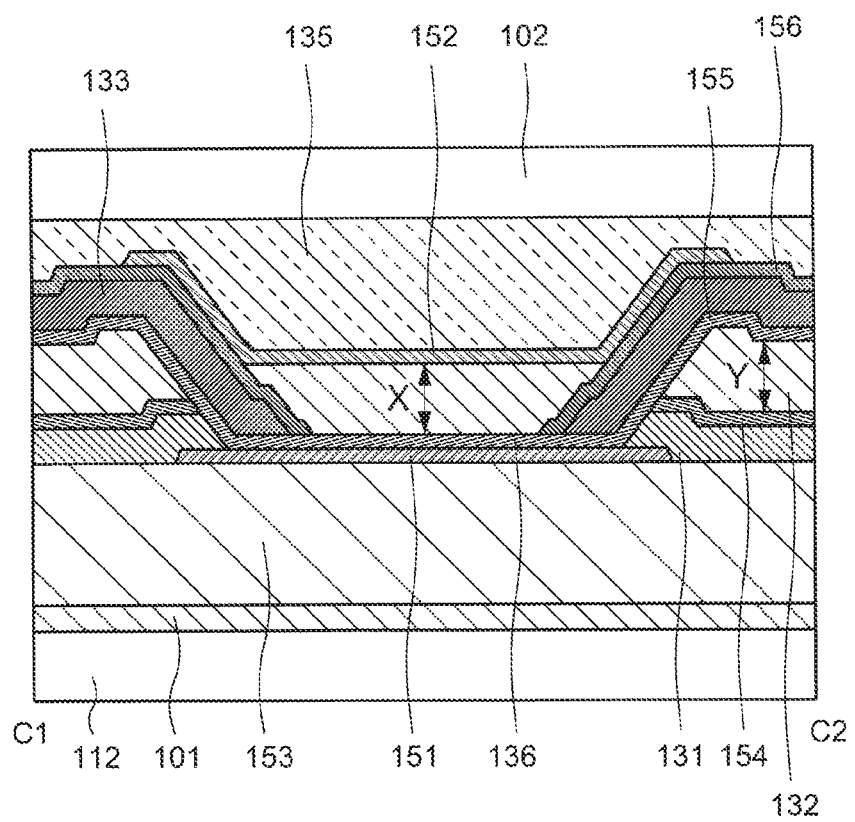
FIG. 12 is a schematic view showing the structure of a display device according to an embodiment of the present invention.

In FIG. 12, a display device is shown having a structure in which a portion thereof differs from that of the display device shown in FIG. 11. The display device shown in FIG. 12, in addition to the structure of the display device shown in FIG. 11, the second metal oxide layer 152 is further provided above the second inorganic insulating layer 133 and the second organic insulating layer 136. By providing the second metal oxide layer 152 above the first organic insulating layer 132 and the second inorganic insulating layer 133, moisture and oxygen may be prevented from permeating from the outside. In addition, adhesion may be improved between the second metal oxide layer 152 and the inorganic interface layer 156 by providing the second metal oxide layer 152 in contact with the inorganic interface layer 156. In this way, the first organic insulating layer 132 and the inorganic interface layer 156 may be prevented from peeling when the display device is bent. Thus, the reliability of the display device may be improved.

Figure 13:
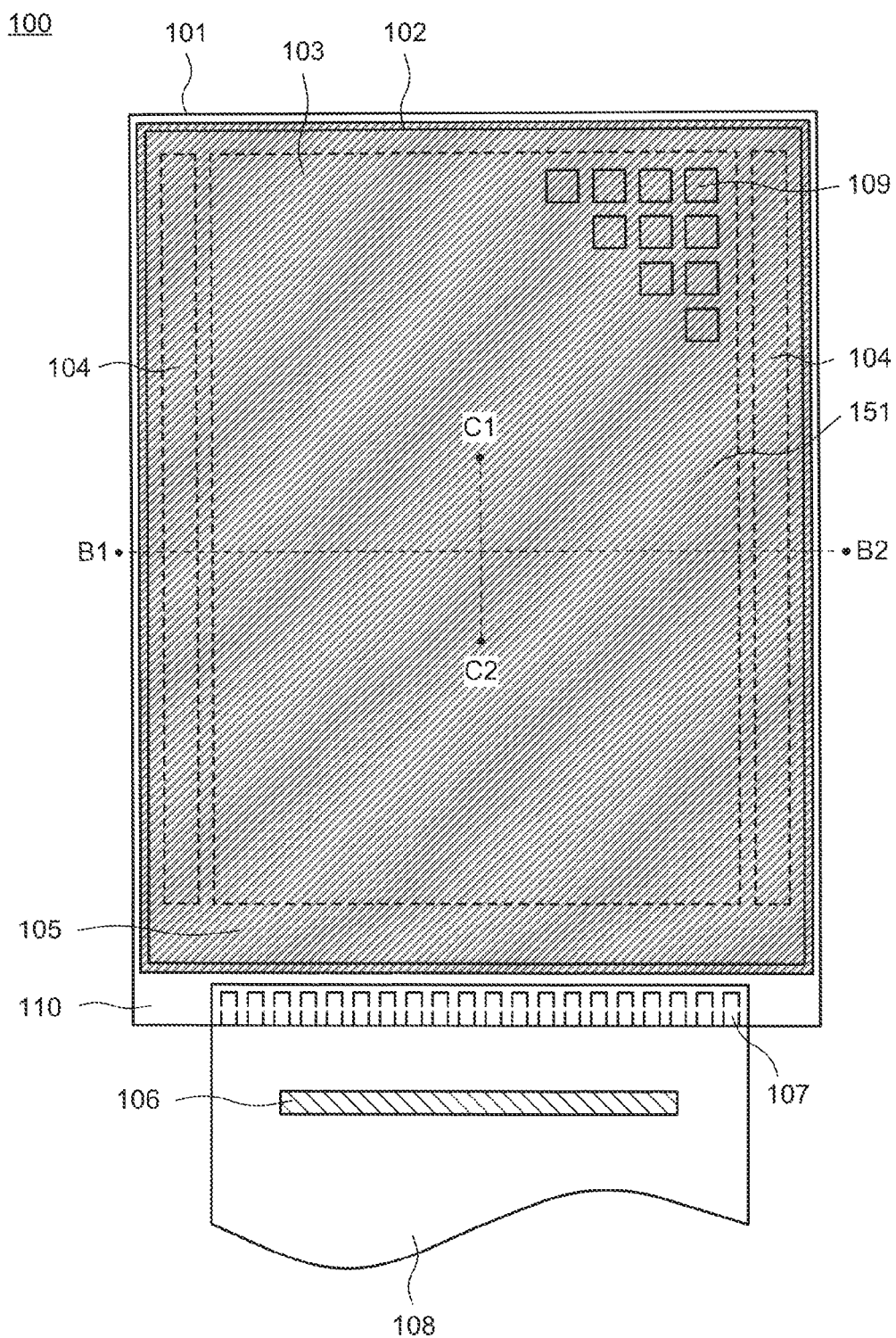
FIG. 13 is a cross-sectional view showing the structure of a display device according to an embodiment of the present invention.

FIG. 13 shows a schematic configuration of a display device partially different from the display device shown in FIG. 1 in a planar view.

The display device shown in FIG. 13, the first metal oxide layer 151 is provided so as to cover the entire display region 103 and the entire scanning line drive circuit 104. The film thickness of the first metal oxide layer 151 is thinner than that of the first inorganic insulating layer 131 and the second inorganic insulating layer 133. Thus, the first metal oxide layer 151 may be provided over the entire display region 103 and the entire scanning line drive circuit 104. Further, a structure in which the first metal oxide layer 151 is provided over the entire display region 103 and the entire scanning line drive circuit 104 is shown in FIG. 13, however, the present invention is not limited to this. The second metal oxide layer 152 may be provided over the entire display region 103 and the entire scanning line drive circuit 104. In this case, the first metal oxide layer 151 may be provided above a portion of the display region 103 and a portion of the scanning line drive circuit 104. In addition, the first metal oxide layer 151 and the second metal oxide layer 152 may be provided over the entire display region 103 and the entire scanning line drive circuit 104.

Figure 14:
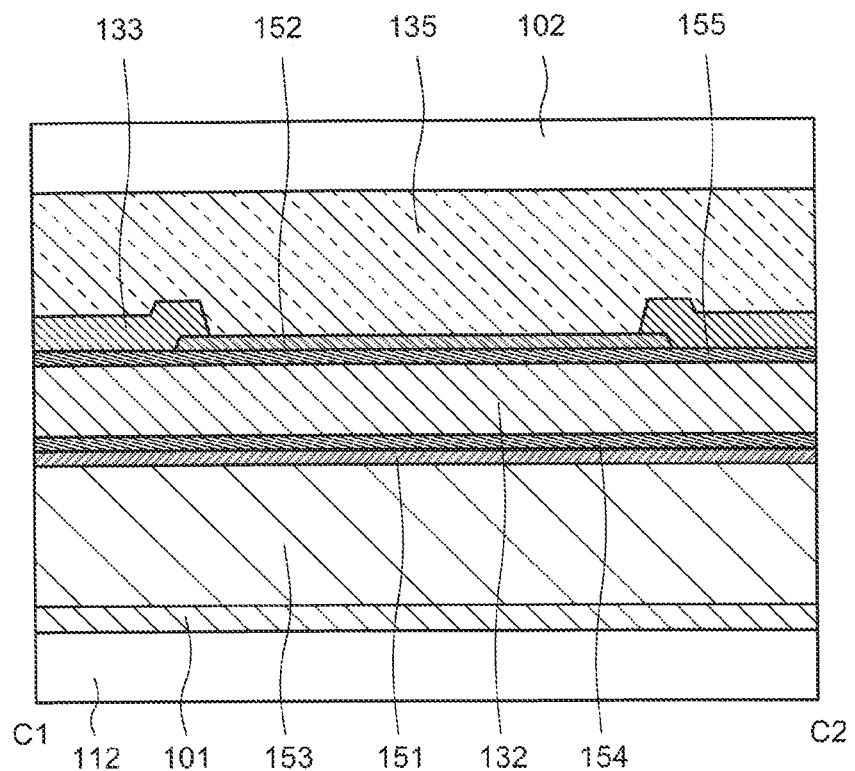
FIG. 14 is a cross-sectional view showing the structure of a display device according to an embodiment of the present invention.

A cross-sectional view taken along line C1-C2 in FIG. 13 is shown in FIG. 14. The element formation layer 153 is provided above the first substrate 101, and the first metal oxide layer 151 is provided above the element formation layer 153. Additionally, the inorganic interface layer 154 is provided above the first metal oxide layer 151, and the first organic insulating layer 132 is provided above the inorganic interface layer 154. Adhesion may be improved between the first metal oxide layer 151 and the first organic insulating layer 132 by providing the inorganic interface layer 154 in between the first metal oxide layer 151 and the first organic insulating layer 132. In addition, the inorganic interface layer 155 is provided above the first organic insulating layer 132, and the second metal oxide layer 152 and the second inorganic insulating layer 133 are provided above the inorganic interface layer 155.

In the region in which the second metal oxide layer 152 is provided, the second inorganic insulating layer 133 is removed so as to expose the upper surface of the second metal oxide layer 152. In the opening of the second inorganic insulating layer 133 exposing the upper surface of the second metal oxide layer 152, the second inorganic insulating layer 133 may be prevented from breaking due to bending the display device. Adhesion may be improved between the first metal oxide layer 151 and the first organic insulating layer 132 by providing the inorganic interface layer 154 between the first metal oxide layer 151 and the first organic insulating layer 132. In addition, adhesion may be improved between the first organic insulating layer 132, and the second metal oxide layer 152 and the second inorganic insulating layer 133 by providing the inorganic interface layer 155 between the first organic insulating layer 132, and the second metal oxide layer 152 and the second inorganic insulating layer 133. In this way, film may be prevented from peeling between the organic insulating layer and the inorganic insulating layer even when the display device is bent, thus the reliability of the display device may be improved. Like the first metal oxide layer 151, the second metal oxide layer 152 may be provided over the entire display region 103 and the entire scanning line drive circuit 104.

As is shown in FIG. 13 and FIG. 14, the first metal oxide layer 151 and the second metal oxide layer 152 are provided over the entire display region 103 and the entire scanning line drive circuit 104. When resist patterning is performed for the metal oxide layers, damage to the element formation layer 153 due to development and the like is a concern, however, such damage may be avoided. When the first metal oxide layer 151 and the second metal oxide layer 152 shown in FIG. 1 are formed, patterning using a mask becomes necessary after forming the metal oxide layers by sputtering. However, by providing the first metal oxide layer 151 and the second metal oxide layer 152 over the entire display region 103 and the entire scanning line drive circuit 104, dimensional accuracy may be lower, or patterning may become unnecessary, thus the cost of the mask may decrease.

Figure 15:
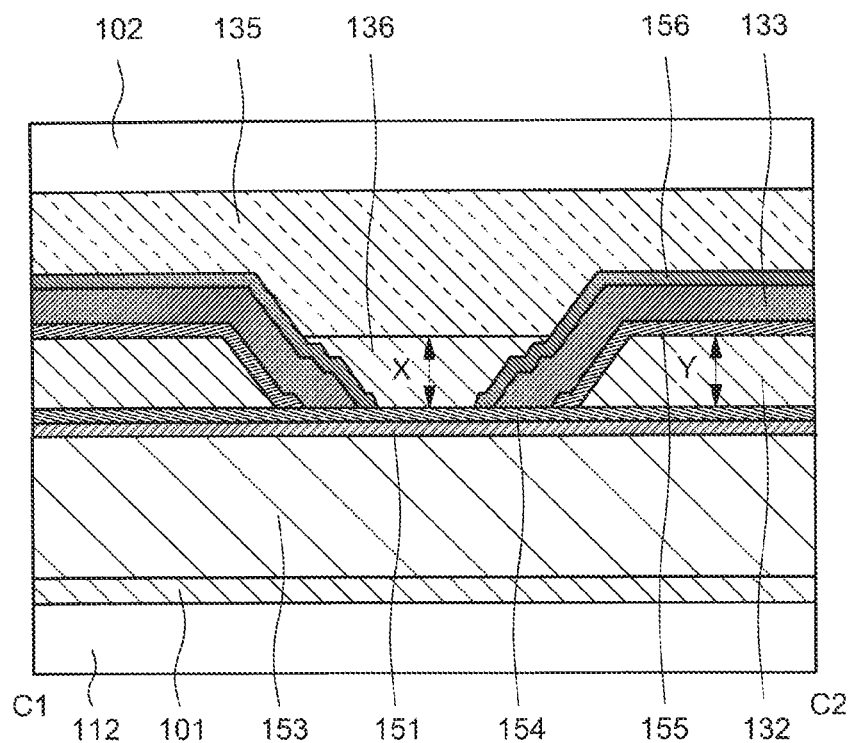
FIG. 15 is a cross-sectional view showing the structure of a display device according to an embodiment of the present invention.

In FIG. 15, a display device is shown having a structure in which a portion thereof differs from that of the display device shown in FIG. 12. The display device shown in FIG. 15, the inorganic interface layer 154 is provided above the first metal oxide layer 151, and the first organic insulating layer 132 is provided above the inorganic interface layer 154. The second inorganic insulating layer 133 is provided above the first organic insulating layer 132 via the inorganic interface layer 155, and the first organic insulating layer 132 is removed so as to expose the upper surface of the inorganic interface layer 154. In addition, the inorganic interface layer 155 is provided above the first organic insulating layer 132, and the inorganic interface layer 155 is removed so as to expose the upper surface of the inorganic interface layer 154. The second inorganic insulating layer 133 is provided above the inorganic interface layer 155, and is removed so as to expose the upper surface of the inorganic interface layer 154. Further, the inorganic interface layer 155 is provided above the second inorganic insulating layer 133, and is removed so as to expose the upper surface of the inorganic interface layer 154. The second organic insulating layer 136 is provided in the regions in which the first metal oxide layer 151 does not overlap with the first organic insulating layer 132, the inorganic interface layer 155, the second inorganic insulating layer 133, or the inorganic interface layer 156 via the inorganic interface layer 154.

The second inorganic insulating layer 133 may be prevented from breaking by folding the display device in the region in which the first metal oxide layer 151 does not overlap the second inorganic insulating layer 133 via the inorganic interface layer 154. Adhesion may be improved between the first metal oxide layer 151 and the first organic insulating layer 132 by providing the inorganic interface layer 154 between the first metal oxide layer 151 and the first organic insulating layer 132. In addition, adhesion may be improved between the first organic insulating layer 132 and the second inorganic insulating layer 133 by providing the inorganic interface layer 155 between the first organic insulating layer 132 and the second inorganic insulating layer 133. Adhesion may be improved between the second inorganic insulating layer 133 and the second organic insulating layer 136 by providing the inorganic interface layer 156 between the second inorganic insulating layer 133 and the second organic insulating layer 136. In this way, film may be prevented from peeling between an organic insulating layer and an inorganic insulating layer even when the display device is bent, thus the reliability of the display device may be improved.

Figure 16:
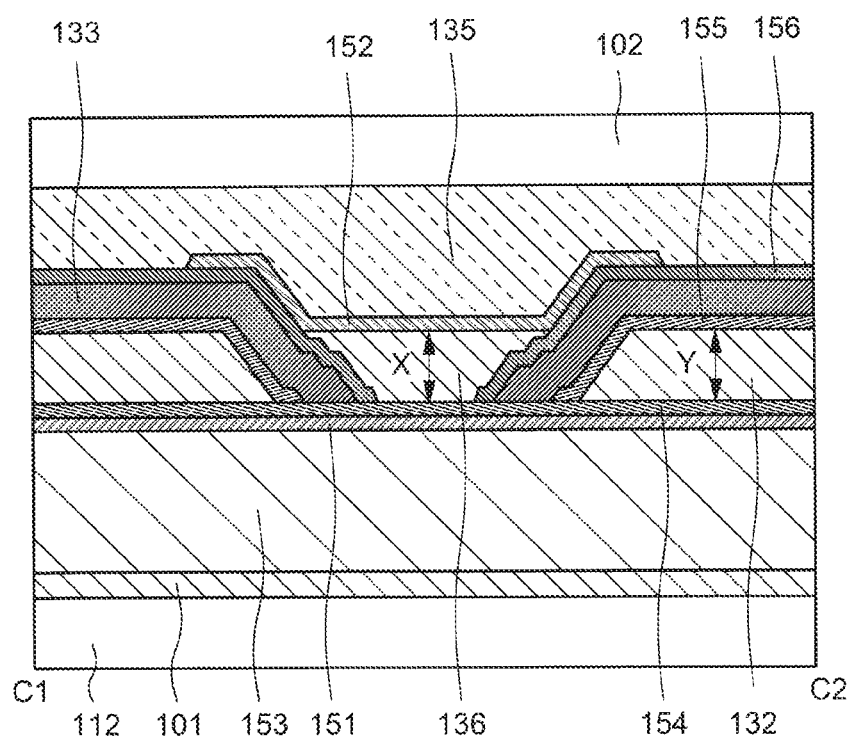
FIG. 16 is a cross-sectional view showing the structure of a display device according to an embodiment of the present invention.

In FIG. 16, a display device is shown having a structure in which a portion thereof differs from that of the display device shown in FIG. 15. The display device shown in FIG. 15, in addition to the structure of the display device shown in FIG. 15, the second metal oxide layer 152 is further provided above the second organic insulating layer 136 and the inorganic interface layer 156. Adhesion may be improved between the inorganic interface layer 156 and the second metal oxide layer 152 by providing the second metal oxide layer 152 above the inorganic interface layer 156 and the second organic insulating layer 136. In this way, film may be prevented from peeling from between the inorganic insulating layer and the organic insulating layer even when the display device is bent, thus the reliability of the display device may be improved. The second metal oxide layer 152 may be provided over the entire display region 103 and the entire scanning line drive circuit 104.

In the present invention, the reason the metal oxide layers and the inorganic insulating layers are selectively used depending on location is as follows. Even though deposition property of the metal oxide layer better than the inorganic insulating layer, it is significantly thinner compared to the inorganic insulating layer, thus there is a possibility that the moisture and oxygen shut-off function may fail. Especially, after foreign matter adheres, the risk that the foreign matter will move is greater for the metal oxide layer than for the inorganic insulating layer. This is because when the metal oxide layer is significantly thinner than the inorganic insulating layer and any sort of force is acted on the foreign matter, that foreign matter will move. As a result, the risk of moisture and oxygen permeating from the places to which foreign matter moves increases. Therefore, in the present invention, the metal oxide layers and the inorganic insulating layers are selectively used depending on the regions of the display device. A metal oxide layer is provided and bending resistance increases in the regions of the display device in which bending resistance is necessary. In the regions in which the display device does not bend, an inorganic insulating layer is provided and sealing defects causing foreign matter are sufficiently suppressed.

Based on the display device described as the embodiments and examples of embodiments of the present invention, any appropriate addition, removal, or alteration of structural elements, or any addition, omission, or alteration of steps made by a person skilled in the art are included in the scope of the present invention, so long as they support the gist of the present invention. Further, the embodiments described above may be combined so long as they are not technologically inconsistent.

Even if the function effects are different from the function effects from the implementation of each of the embodiments described above, it is understood that anything made clear from the contents of the present specification, or anything easily predicted by a person skilled in the art, naturally comes from the present invention.

What is claimed is:

1. A display device comprising:
   a flexible substrate on which a bendable display region, a display region, a bendable peripheral region, and a peripheral region are arranged, the bendable peripheral region and the peripheral region surrounding the display region and the bendable display region;
   a TFT layer including first thin film transistors, second thin film transistors, a third thin film transistors, fourth thin film transistors, and inorganic insulation films on the flexible substrate;
   an organic insulation layer on the TFT layer;
   an organic light emitting element layer including first organic light emitting elements and second light emitting elements on the organic insulation layer; and
   a sealing layer which is arranged on the organic light emitting element layer and includes a first inorganic insulation sealing layer, an organic insulation material on the first inorganic insulation sealing layer, a second inorganic insulation sealing layer on the organic insulation material, wherein
the bendable display region includes first pixels, each of which includes each of the first thin film transistors and each of the first organic light emitting elements,
the display region includes second pixels, each of which includes each of the second thin film transistors and each of the second organic light emitting elements,
the bendable peripheral region includes the third thin film transistors,
the peripheral region includes the fourth thin film transistors,
the first inorganic insulation sealing layer is in contact with the second inorganic insulation sealing layer and the sealing layer is in contact with the TFT layer in a first region in which the organic insulation layer is removed in the bendable peripheral region,
the first inorganic insulation sealing layer is in contact with the second inorganic insulation sealing layer and the sealing layer is in contact with the TFT layer in a second region in which the organic insulation layer is removed in the peripheral region,
the first inorganic insulation sealing layer includes a first metal oxide layer in the bendable display region and the bendable peripheral region and a first sealing film in the display region and the peripheral region,
the second inorganic insulation sealing layer includes a second metal oxide layer in the bendable display region and the bendable peripheral region and a second sealing film in the display region and the peripheral region,
a first thickness of the first metal oxide layer is thinner than a second thickness of the first sealing film,
a third thickness of the second metal oxide layer is thinner than a fourth thickness of the second sealing film,
each of the first sealing film and the second sealing film is made of silicon nitride or silicon oxynitride, and
the first sealing film and the second sealing film are not arranged in the bendable display region and the bendable peripheral region.

2. The display device according to claim 1, wherein each of the first metal oxide layer and the second metal oxide layer is made of $Al_2O_3$, $HfO_2$, HfSiO, $La_2O_3$, $SiO_2$, STO, $Ta_2O_2$, or ZnO.

3. The display device according to claim 1, wherein each of the first metal oxide layer and the second metal oxide layer is prepared by an atomic layer deposition method, and
each of the first sealing film and the second sealing film is prepared by a chemical vapor deposition method.

4. The display device according to claim 1, wherein the first inorganic insulation sealing layer includes a first inorganic interface layer,
the second inorganic insulation sealing layer includes a second inorganic interface layer,
the first inorganic interface layer is arranged between the first metal oxide layer and the organic insulation material in the bendable display region and the bendable peripheral region,
the second inorganic interface layer is arranged between the second metal oxide layer and the organic insulation material in the bendable display region and the bendable peripheral region,
the first inorganic interface layer is arranged between the first sealing film and the organic insulation material in the display region and the peripheral region,
the second inorganic interface layer is arranged between the second sealing film and the organic insulation material in the display region and the peripheral region.

5. The display device according to claim 4, wherein each of the first inorganic interface layer and the second inorganic interface layer is made of amorphous silicon or silicon oxide, and
a fifth thickness of the first inorganic interface layer is thinner than the second thickness of the first sealing film, and
a sixth thickness of the second inorganic interface layer is thinner than the fourth thickness of the second sealing film.

6. The display device according to claim 1, wherein a first hydrogen concentration of the first metal oxide layer is lower than a second hydrogen concentration of the first sealing film, and
a third hydrogen concentration of the second metal oxide layer is lower than a fourth hydrogen concentration of the second sealing film.

7. A display device comprising:
a flexible substrate on which a bendable display region and a display region are arranged, a bendable peripheral region, and a peripheral region are arranged, the bendable peripheral region and the peripheral region surrounding the display region and the bendable display region;
a TFT layer including first thin film transistors, second thin film transistors, and inorganic insulation films on the flexible substrate;
an organic insulation layer on the TFT layer;
an organic light emitting element layer including first organic light emitting elements and second light emitting elements on the organic insulation layer; and
a sealing film which is arranged on the organic light emitting element layer and includes a first inorganic insulation sealing layer, an organic insulation material on the first inorganic insulation sealing layer, a second inorganic insulation sealing layer on the organic insulation material,
wherein
the bendable display region includes first pixels, each of which includes each of the first thin film transistors and each of the first organic light emitting elements,
the display region includes second pixels, each of which includes each of the second thin film transistors and each of the second organic light emitting elements,
the first inorganic insulation sealing layer includes a first metal oxide layer in the bendable display region and the bendable peripheral region and a first sealing film in the display region and the peripheral region,
the second inorganic insulation sealing layer includes a second metal oxide layer in the bendable display region and the bendable peripheral region and a second sealing film in the display region and the peripheral region,
a first thickness of the first metal oxide layer is thinner than a second thickness of the first sealing film,
a third thickness of the second metal oxide layer is thinner than a fourth thickness of the second sealing film,
each of the first sealing film and the second sealing film is made of silicon nitride or silicon oxynitride, and
the first sealing film and the second sealing film are not arranged in the bendable display region.

8. The display device according to claim 7, wherein each of the first metal oxide layer and the second metal oxide layer is made of $Al_2O_3$, $HfO_2$, HfSiO, $La_2O_3$, $SiO_2$, STO, $Ta_2O_2$, or ZnO.

9. The display device according to claim 7, wherein
each of the first metal oxide layer and the second metal oxide layer is prepared by an atomic layer deposition method, and
each of the first sealing film and the second sealing film is prepared by a chemical vapor deposition method.

10. The display device according to claim 7, wherein
the first inorganic insulation sealing layer includes a first inorganic interface layer,
the second inorganic insulation sealing layer includes a second inorganic interface layer,
the first inorganic interface layer is arranged between the first metal oxide layer and the organic insulation material in the bendable display region,
the second inorganic interface layer is arranged between the second metal oxide layer and the organic insulation material in the bendable display region,
the first inorganic interface layer is arranged between the first sealing film and the organic insulation material in the display region,
the second inorganic interface layer is arranged between the second sealing film and the organic insulation material in the display region.

11. The display device according to claim 10 wherein
each of the first inorganic interface layer and the second inorganic interface layer is made of amorphous silicon or silicon oxide, and
a fifth thickness of the first inorganic interface layer is thinner than the second thickness of the first sealing film, and
a sixth thickness of the second inorganic interface layer is thinner than the fourth thickness of the second sealing film.

12. The display device according to claim 7, wherein
a first hydrogen concentration of the first metal oxide layer is lower than a second hydrogen concentration of the first sealing film, and
a third hydrogen concentration of the second metal oxide layer is lower than a fourth hydrogen concentration of the second sealing film.

* * * * *